United States Patent
Hirvilampi et al.

(10) Patent No.: US 6,614,299 B2
(45) Date of Patent: Sep. 2, 2003

(54) METHOD AND SYSTEM FOR AUTOMATED CURRENT BALANCE ADJUSTMENT FOR PARALLEL COMBINED AMPLIFICATION ELEMENTS

(75) Inventors: Mika Hirvilampi, Lewisville, TX (US); Juha Maatta, Coppell, TX (US); Mikko Nieminen, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/002,276

(22) Filed: Nov. 2, 2001

(65) Prior Publication Data

US 2003/0085760 A1 May 8, 2003

(51) Int. Cl.$^7$ .............................. H03F 3/68; H03F 3/04
(52) U.S. Cl. ................... 330/124 R; 330/295; 330/305
(58) Field of Search ............................. 330/124 R, 295, 330/305

(56) References Cited

U.S. PATENT DOCUMENTS 5,256,987 A * 10/1993 Kibayashi et al. .......... 330/284
5,886,573 A * 3/1999 Kolanek ...................... 330/10
5,973,559 A * 10/1999 Alberty ................... 330/124 R
6,294,956 B1 * 9/2001 Ghanadan et al. ...... 330/124 R

FOREIGN PATENT DOCUMENTS

WO      WO 00/64072       10/2000

\* cited by examiner

*Primary Examiner*—Patricia Nguyen
(74) *Attorney, Agent, or Firm*—Cohen, Pontani, Lieberman & Pavane

(57) ABSTRACT

A method and system to balance a signal through a plurality of parallel amplifier elements of an amplifier device. An input signal to the amplifier device is divided substantially equally among a plurality of parallel amplifier elements. A signal through each of the amplifier elements is measured. If any of the measured signals deviates by a predetermined threshold from a reference signal, an adjustment to an input parameter to a tuning circuit associated with the particular amplifier element is determined. The determined adjustment is applied to the particular a tuning circuit to appropriately adjust the output of the deviating amplifier element. The output of the plurality of amplifier elements is combined as the total output of the amplifier device.

16 Claims, 3 Drawing Sheets

METHOD AND SYSTEM FOR AUTOMATED CURRENT BALANCE ADJUSTMENT FOR PARALLEL COMBINED AMPLIFICATION ELEMENTS

BACKGROUND OF THE INVENTION

1. Field of the Invention

The present invention relates to amplifier circuits and, in particular, is directed to a method and system for balancing a signal through parallel combined amplifier elements or amplifier sub-units within an amplifier device.

2. Description of the Related Art

RF power amplifiers are often configured as a plurality of amplifier elements that are combined in parallel. One example of the an RF power amplifier having parallel combined amplifier elements is a Base Transceiver Station (BTS) power amplifier. To implement the parallel configuration, the amplifier uses a power divider to divide the input signal between two or more parallel amplifier elements. The divided signal is amplified through the amplifier elements and then combined using a power combiner.

The various components of the amplifier may be subject to operational inconsistencies or defects. For example, the impedance of the amplifier elements, which are intended to be identical, may actually vary from one amplifier element to another in response to different input signal frequencies, input power levels, ambient temperatures, etc. Differences in gain and efficiency of different amplifier elements, variations in impedance matching components, imbalance in dividing power in the power divider, and variations in bias circuitry may also occur. These and other problems may cause an imbalance in the signals through the amplifier elements.

The effect of signal imbalances between amplifier elements is that one or more of the amplifier elements may operate in a more non-linear region than the other amplifier elements. This degrades the linearity of the overall amplifier and the reliability of the amplifier element which is under the heaviest stress, i.e., having the highest power consumption. Since some sub-units will no longer operate in an optimal region, the various sub-units may be driven at different power levels which degrades the overall efficiency and amplification characteristic of the amplifier device as a whole. Moreover, many of these problems become exacerbated when the amplifier operates at high power levels.

Different solutions to balance the signal between the various amplifier elements within an amplifier device are possible. Trimmer elements may be used to manually tune the operating conditions of the amplifier. Alternatively, larger and more expensive amplifier elements can be used to ensure linear performance and reliability in view of design margins for signal imbalance. High accuracy dividing and combining elements may also be used. However, these alternatives are relatively expensive and/or require user interaction.

SUMMARY OF THE INVENTION

The present invention is directed to a method and system to balance a signal through parallel combined amplifier elements or amplifier sub-units in an amplifier device. In one embodiment, automated adaptive feedback control is used to adjust an input parameter associated with one or more of the amplifier elements. Examples of the input parameters that may be adjusted include power level, impedance, and bias point.

A signal passing through each of the parallel amplifier elements is measured and compared. If a difference between the measured signals exceeds a predetermined threshold difference, an adjustment is then made by a control circuit to a pre-selected input parameter for at least one of the amplifier elements. As a result, each of the amplifier elements within the amplifier device are controlled to operate at their most efficient and reliable amplification range.

The present invention is that it allows for the automatic, fast, adaptive and continuous balancing of signals through the parallel combined amplifier elements, resulting in improved stability of the amplifier elements and overall improved performance, linearity, reliability, and efficiency of the entire amplifier device. The increased stability of the amplifier device also enables the use of cheaper components. Because the performance of each of the plurality of parallel amplifier elements in continuously monitored and controlled, cheaper, more optimal sized, and less tolerance matched amplifier elements can be used.

The amplifier device of the present invention is suitable for use as an RF power amplifier, such as an EDGE (Enhanced Data Rates for Global Evolution) power amplifier in a base transceiver station (BTS) having a balanced final stage. However, the amplifier-of the present invention is not limited to amplifiers operating in RF.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the drawings, wherein like reference numerals delineate similar elements throughout the several views.

DETAILED DESCRIPTION OF THE PRESENTLY PREFERRED EMBODIMENTS

Figure 1:
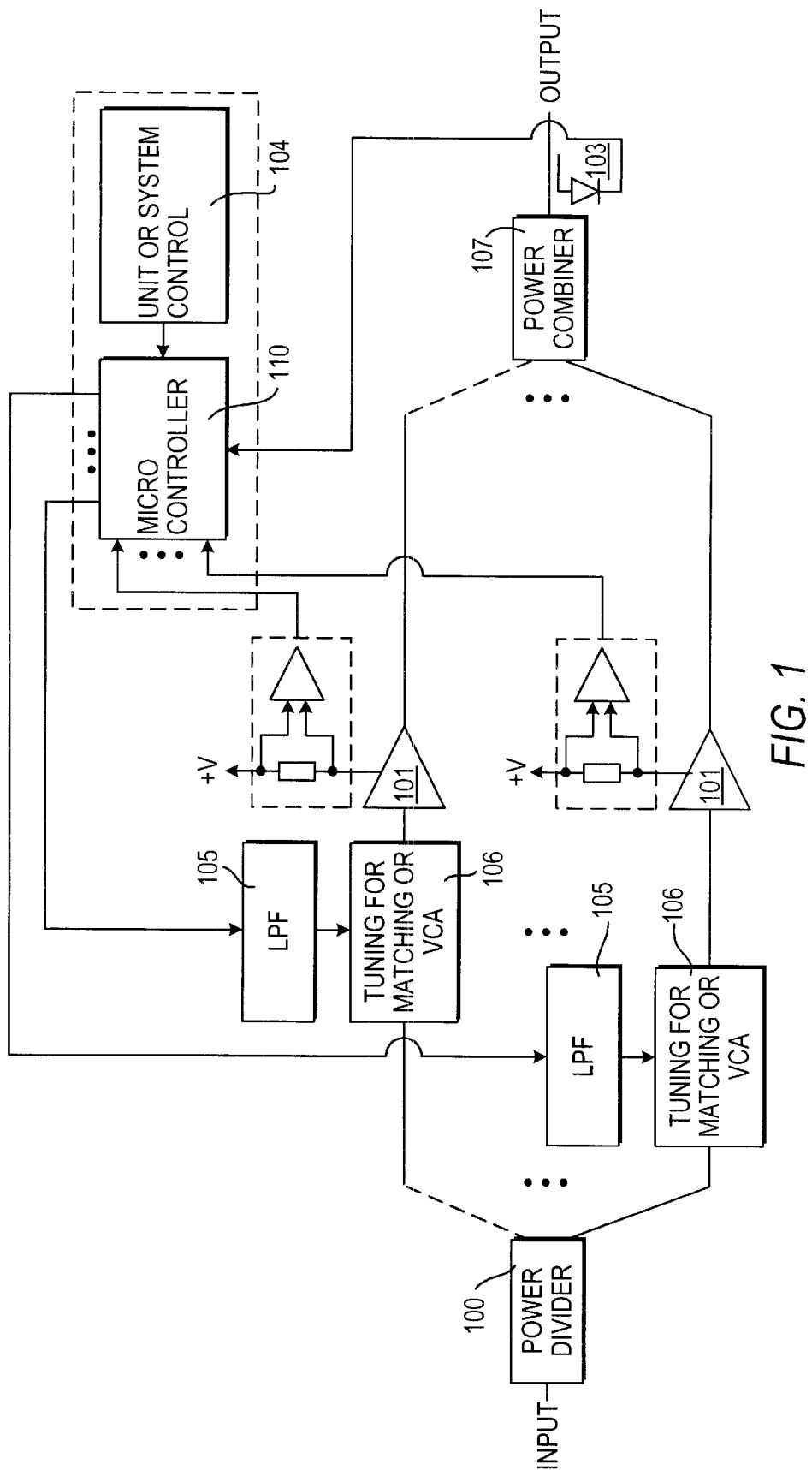
FIG. 1 is a block diagram of one embodiment of a system of the present invention.

FIG. 1 is a block diagram of one embodiment of an amplifier system of the present invention. The input signal enters the amplifier device at a power divider 100 which splits the input signal into a plurality of substantially equal signals. Although the signal is shown as only being split into two portions, the three dots proximate power divider 100 and the dashed upper output line from power divider 100 indicate that the power divider 100 may alternatively split the input signal into more than two signals. The power divider can also include signal phase shifting in some cases, e.g., a balanced amplifier configuration. The signal on each parallel output line from power divider 100 is then applied to a tuning circuit 106, which tunes the signal in accordance with a filtered control signal received from a microcontroller 110. The three dots proximate the tuning circuits 106 indicate that more than two power tuning circuits 106, and the other elements associated therewith, may be used to correspond to the number of split input signals.

Each parameter tuning circuit 106 comprises various components to adjust the different parameters of the amplifier elements 101 in response to a control signal received from the microcontroller 110. For example, the parameter tuning circuit 106 may comprise a variable attenuator to adjust the power level, signal level, or impedance of an associated amplifier element 101. The variable attenuator is either analog or digital depending on the type of control applied in the parameter tuning circuit 106. Types of variable attenuators include a voltage-controlled variable or step attenuator and a current-controlled PIN-diode attenuator. The parameter tuning circuit 106 may also comprise a varactor diode or some other variable reactive element to adjust the power level of the associated amplifier element 101 through impedance matching. Additionally, the parameter tuning circuit 106 may comprise one or more transistors to adjust the bias point of the associated amplifier element 101. Such bias control is best suited in situations where the linearity of the amplifier is not critical. For example, constant envelope modulation schemes, e.g., in GSM systems, do not require linearity of the amplifier device. The tuner circuit 106 may operate in response to either digital or analog control signals depending upon the particular microcontroller 110 selected.

The output signal from the tuner 106 on each divided parallel line is then applied to an amplifier 101 which amplifies the signal. The amplifier elements 101 may be analog or digital, are intended to be substantially identical, and may comprise LDMOS (Laterally Diffused Metal Oxide Semiconductor) based devices in a final stage of a multi-stage power amplifier.

Associated with each amplifier 101 is a signal measurement circuit 102 which measures the signal through its respective amplifier 101. In one embodiment, each signal measurement circuit 102 measures a DC current through its associated amplifier element 101. Such an embodiment may comprise a resistor, a power supply and a precision operational amplifier, having a low offset voltage and current, which measures the voltage drop over the resistor, corresponding to the DC current through the amplifier element 101. To maximize the efficiency of the signal measurement circuit 102, the losses in the resistor must be minimized. The signal measurement circuit 102 may instead be configured to measure other types of signals. For example, the signal measurement circuit 102 may measure the power and/or the voltage at the associated amplifier elements 101. The measurement of the signals may be performed constantly, or intermittently, such as only at times when the power level is high, at specific predetermined time intervals, or upon the occurrence of specific events, such as during an active part of a bursty transmission in a TDMA (Time Division Multiple Access) system. The output of each signal measurement circuit 102 is fed to the microcontroller 110 where it is used to adjust the output of the tuning circuits 106 and thus the amplifier elements 101. The three dots proximate the left side of the microcontroller 110 indicate that there are more than two inputs from the signal measurement circuits 102 if there are more than two signal measurement circuits 102.

The amplified output signals generated by all of the amplifier elements 101 are fed to and combined together by a power combiner 107 which generates a combined output signal. The three dots proximate the power combiner 107 indicate that there are more than two inputs thereto if there are more than two amplifier elements 101.

A power detector 103 measures the output of the power combiner 107 and generates a signal characteristic of that output signal and supplies this measurement signal to the microprocessor 110. Although power detector 103 may be digital, it is preferably analog, especially for constant envelope modulation systems, e.g., GSM. In one embodiment, the power detector 103 provides a timing signal to the microprocessor 110 if the cumulative power of the amplifier elements 101, i.e., the power at the output of the power combiner 107, exceeds a predefined threshold value. A suitable power detector 103 is one typically used in constant envelope modulation systems, e.g., GSM (Global System for Mobile Communications). The measurement signal from the power detector 103 is used by the microcontroller 110 to further adjust the outputs of the tuning circuits and thus amplifier elements 101.

The microcontroller 110 determines whether a balancing of the signals through any one or more of the amplifier elements 101 is required. The microcontroller 110 receives the measured signals from the signal measurement circuits 102 and compares the measured signals to one another, to one measured signal used as a standard, or to a pre-defined, stored reference standard to determine whether any adjustment of the output of any one or more of the amplification elements 101 is necessary. In one embodiment, if comparison of the measured signals results in a difference, such as if a predetermined threshold difference is exceeded, the microcontroller 110 determines what adjustment is required to an input parameter associated with the one (or more) amplifier element 101 that requires adjustment.

The microcontroller 110 provides the parameter adjustment control signal to the tuning circuit 106 associated with the amplifier element 101 requiring adjustment. The three dots proximate the top of the microcontroller 110 indicate that there are more than two outputs if there are more than two parameter tuning circuits 106. The microcontroller 110 may adjust the input parameter of the parameter tuning circuits 106, either periodically, continuously, or only upon the occurrence of a specific predefined event. A conversion of the digital control signal from the microcontroller 110 may be needed depending on the type of parameter control at the parameter tuning circuit 106. If the parameter tuning circuit 106 is subject to analog control, the control signal is converted into an analog format and may be filtered by a low pass filter 105 which filters high frequency harmonics and spurious signals typically associated with a digital to analog conversion of the control signal. If the parameter tuning circuit 106 is digitally controlled, the control signal is preferably sent directly from the microcontroller 110 to the parameter tuning circuit 106. To provide this direct coupling, the system may implement a bypass across (not shown) the low pass filters 105.

Figure 2:
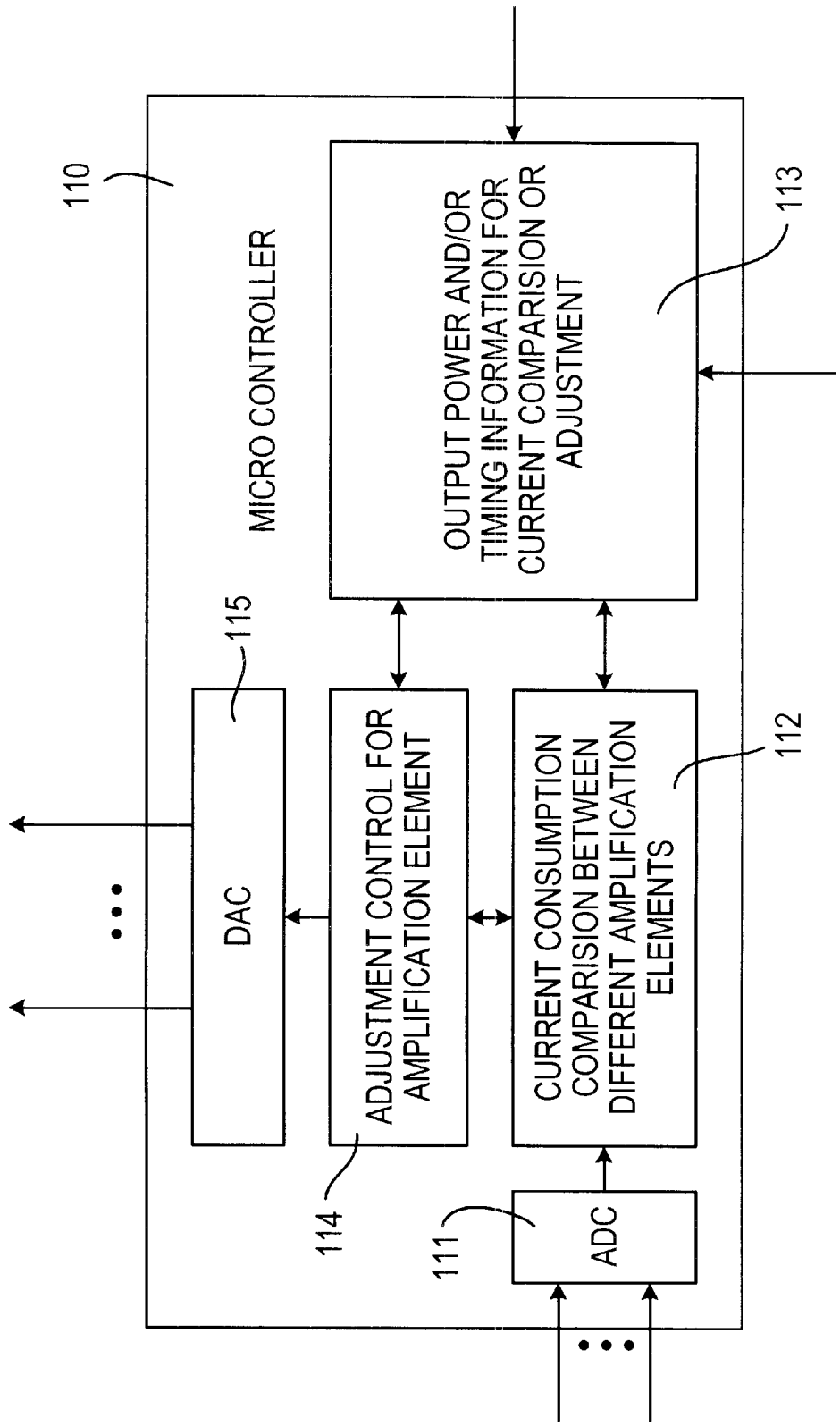
FIG. 2 is a block diagram of one embodiment of a microcontroller of used in the embodiment shown in FIG. 1.

As shown in FIG. 2, which is a detailed drawing of one embodiment of the microcontroller 110 shown in FIG. 1, the microcontroller 110 comprises an analog to digital converter (ADC) 111, a signal comparison circuit 112, a power/timing control circuit 113, an adjustment control circuit 114, and a digital to analog converter (DAC) 115.

The ADC 111 and the DAC 115 are used to convert the signals to/from analog form from/to digital form and may be omitted depending upon the other components used, that is, if all or some of the components of the amplifier device are digital, the ADC 111 and/or the DAC 115 may be omitted, as appropriate. The measured signals from the plurality of signal measurement circuits 102 pass through the ADC 111 to the signal comparison circuit 112 which compares the measured signals from the plurality of signal measurement circuits 102 to one another, to one measured signal used as a standard, or to a pre-defined, stored reference standard. The power/timing control circuit 113 receives a timing control signal from the unit controller 104 (shown in FIG. 1), and/or a timing or power signal from the power detector 103, and possibly also a signal from the signal comparison circuit 112 to indicate that a signal comparison has been performed. In response to these received signals, the timing control circuit 113 instructs the signal comparison circuit 112 to initiate a signal comparison and, if appropriate, controls the output of the adjustment control circuit 114. The adjustment control circuit 114 sends a plurality of individual signals through DAC 115 to each of the plurality of tuning circuits 106 which ultimately adjust the output of the respective plurality of amplifier elements 106.

The unit controller 104 may provide control of the microcontroller at baseband or at other frequencies. The unit controller 104 may be embodied in an existing ASIC (Application Specific Integrated Circuit).

In operation, an input signal is applied to power divider 100 which divides the input signal into a plurality of substantially similar parallel outputs, each being fed to a tuning circuit 106, and then to an amplifier element 101. A signal measurement circuit 102 associated with each amplifier element 101 measures the signal after it has been amplified by its respective amplifier 101 and transmits this measurement signal to the signal comparison circuit 112 of the microcontroller 110. The signal comparison circuit 112 compares the plurality of measurement signals to ascertain whether any one or more of the outputs of the amplifier elements 101 need to be adjusted. The measurement signals are compared by the signal comparison circuit 112 to one another, to one measured signal used as a standard, or to a predefined, stored reference standard to determine whether any adjustment of the output of any one or more of the amplification elements 101 is necessary. Simultaneously, the amplified parallel signals from the amplifier elements 101 are combined by power combiner 107 to produce a single amplified output signal. This output signal is measured by a power detector 103, and a signal characteristic of the measured total output signal is transmitted from the power detector 103 to the power/timing control circuit 113 of microcontroller 110. This signal characteristic of the measured total output may be used to further adjust the individual outputs of the amplifier elements 101, such as effectively to increase or decrease their individual gains so that a particular desired total output power or gain is achieved. Alternatively, the signal from the power detector 103 may be used as a timing signal to signal when adjustment of the outputs of the amplifier elements 101 should be made, or when comparisons of measurement signals from the signal measurement circuits 102 should be made. Accurate timing may be needed to perform signal measurement and adjustment at high input signal power levels and also in TDMA systems during the active part of the burst. Based upon instructions from the power/timing control circuit 113 and the comparisons made by signal comparison circuit 112, adjustment control circuit 114 ascertains which amplifier outputs, if any, are to be adjusted and by how much, and generates a plurality of instruction signals which are individually transmitted to each of the plurality of parameter tuning circuits 106. The adjustment control circuit 114 may optionally include a look up table (LUT) to store parameter values or adjustments (for transmittal to parameter tuning circuits 106) correlated to differences calculated by the signal comparison circuit 112. The look-up table may, for example, contain adjustments that are dependent upon signal frequency, power level, and/or ambient temperature. Each of the parameter tuning circuits 106 then correspondingly adjusts its respective portion of the input signal that is received from the power divider 100 and transmits this adjusted input signal portion to its respective amplifier element 101 so as to adjust the output of that amplifier element 101. To minimize interference caused by a parameter change, it is preferable to perform parameter adjustment during an idle state of an input signal or between transmission bursts.

By effectively individually adjusting the outputs of the individual amplifier elements 101, operational inconsistencies among the amplifier elements 101 are substantially eliminated. Such operational inconsistencies between amplifier elements 101 may include, for example, gain, efficiency, or impedance that may vary differently in response to different input signal frequencies, power levels, and ambient temperatures. Other inconsistencies in the plurality of parallel amplifier circuits that can be corrected include imbalances in dividing power in the power divider 100, variations of impedance matching components, and variations in bias circuitry.

Although the adjustment control circuit 114 may provide different control signals to the various tuning circuits 106 depending upon how much adjustment, if any, is required in the output of the associated amplifier element 101, alternatively, all of the adjustment control circuits 114 may receive the same control signal from the adjustment control circuit 114 of the microcontroller 110. In this case, each parameter tuning circuit 106 has appropriate circuitry to filter or otherwise identify the signal for its associated amplifier element 101, e.g., through use of a header or predefined field in the adjustment control signal. In a further alternative, a control signal is sent from the adjustment control circuit 114 only to those parameter tuning circuits 106 which have amplifier elements 101 that require adjustment.

Figure 3:
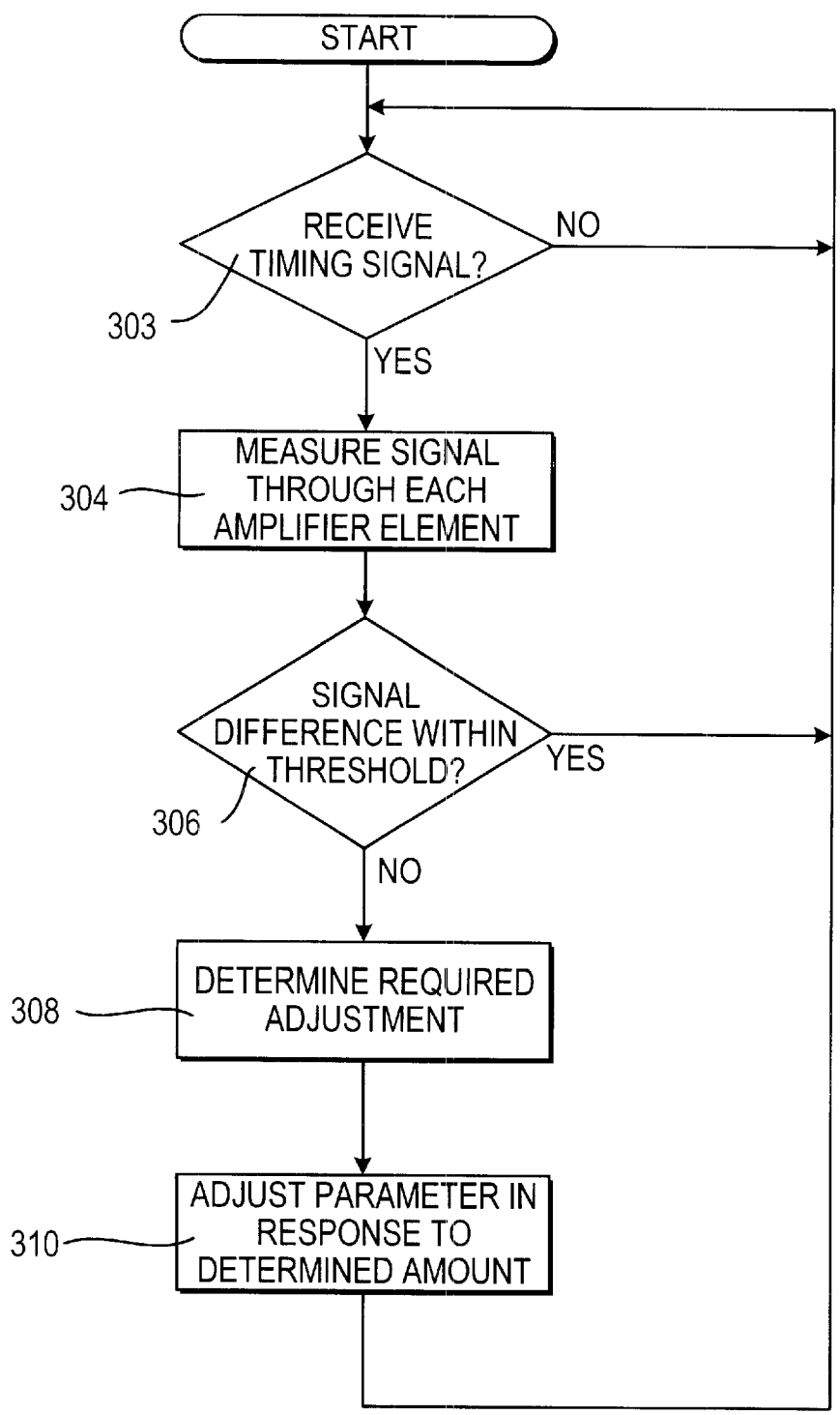
FIG. 3 is a flow chart of a method for balancing a signal through an amplifier having a plurality of parallel amplifier elements in accordance to the present invention.

FIG. 3 depicts a flow chart of a method for balancing a signal through an amplifier having parallel combined amplifier elements 101 in accordance with the present invention. Initially, it is determined whether a timing signal is received at the timing control circuit 113 of the microcontroller 110, step 302. The timing signal is received from either the power detector 103 or the unit controller 104. If no timing signal is received, the method returns to step 302. Thus, the method repeats step 302 until a timing signal is received at the timing control circuit 113. Alternatively, if adjustment of the amplifier elements 101 is not performed in response to a timing signal, step 302 is eliminated. If a timing signal is received, the signal through each amplifier element 101 is measured, step 304. It is then determined whether the difference of the signals measured by the signal measurement circuits 102 of amplifier elements 101 and compared by the signal comparison circuit 112 are each within a predetermined threshold value, step 306. If the signal difference is within the predetermined threshold value, the method returns back to step 302. In this case, no adjustment to the amplifier elements 101 is considered necessary. If the signal difference is not within the predetermined threshold value, the adjustment control circuit 114 determines a required adjustment to balance the signals through one or more of the amplifier elements 101, as appropriate, step 308. The plurality of parameter tuning circuits 107 receive the signal from the adjustment control circuit 114 and adjust, where necessary, the parameter in accordance with the received signal, step 310. The method then returns to step 302 where the method remains until the next timing signal is received. Although the various steps are described as occurring one after the other, preferably, all of the steps are performed simultaneously in parallel.

Although some of the elements of the device of the present invention are disclosed as being analog devices, they may alternatively be digital, and viceversa.

Thus, while there have been shown and described and pointed out fundamental novel features of the present invention as applied to a preferred embodiment thereof, it will be understood that various omissions and substitutions and changes in the form and details of the devices described and illustrated, and in their operation, and of the methods described may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

What is claimed is:

1. A method for balancing a signal through an amplifier device having a plurality of amplifier elements comprising following steps:

dividing an input signal to the amplifier device substantially equally among a plurality of amplifier elements arranged in parallel;

combining signals output by the plurality of amplifier elements into a total output signal of the amplifier device;

measuring a signal through each of the plurality of amplifier elements;

determining whether the measured signal for each of the plurality of amplifier elements deviates by a threshold amount from a desired signal;

if the deviation of the measured signal for any of the plurality of amplifier elements exceeds the threshold amount, determining an amount of adjustment required to an input parameter associated with the amplifier element to cause the amplifier element to operate so that its measured signal is within the threshold amount of the desired signal;

adjusting by tile adjustment amount an input parameter associated with the amplifier element for which the measured signal is not within the threshold amount of the desired signal; and measuring total output signal of the amplifier device and using the measurement of the total output signal to determine the amount of adjustment.

2. The method of claim 1, wherein said steps are periodically performed.

3. The method of claim 1, wherein said steps are continuously performed.

4. The method of claim 1, wherein the signal measured through each of the plurality of amplifier elements is a current.

5. The method of claim 1, wherein the signal measured through each of the plurality of amplifier elements is a voltage.

6. An amplifier device comprising:

a signal divider for dividing an input signal into a plurality of substantially equal divided signals;

a plurality of tuner elements arranged in parallel so that each of the plurality of tuner elements receives one of the divided signals from said signal divider, each of said tuner elements being capable of adjusting its output in response to receipt of an adjustment signal;

a plurality of amplifier elements arranged in parallel so that each of the plurality of amplifier elements receives an output from one of the plurality of tuner elements;

a signal combiner for combining signals output by the plurality of amplifier elements into a total output signal of the amplifier device;

a plurality of signal measuring devices for measuring a signal through each of the plurality of amplifier elements;

a processor receiving the plurality of measured signals from said plurality of signal measuring devices for determining whether the measured signal for each of said plurality of amplifier elements deviates by a threshold amount from a desired signal, and if the deviation of the measured signal for any of said plurality of amplifier elements exceeds the threshold amount, for determining an amount of adjustment required to be transmitted to a tuner element transmitting its output to a deviating amplifier clement to cause the deviating amplifier element to operate so that its measured signal is within the threshold amount of the desired signal, and for transmitting an adjustment signal to said tuner elements; and a means for measuring total output signal of the amplifier device, wherein said processor uses the measurement of the total output signal to determine the amount of adjustment.

7. The amplifier device of claim 6, wherein said processor determines the adjustments periodically.

8. The amplifier device of claim 6, wherein said processor determines the adjustments continuously.

9. A method for balancing a signal through an amplifier device having a plurality of amplifier elements comprising following steps:

dividing an input signal to the amplifier device substantially equally among a plurality of amplifier elements arranged in parallel;

combining signals output by the plurality of amplifier elements into a total output signal of the amplifier device;

measuring a signal through each of the plurality of amplifier elements;

determining whether the measured signal for each of the plurality of amplifier elements deviates by a threshold amount from a desired signal;

if the deviation of the measured signal for any of the plurality of amplifier elements exceeds the threshold amount, determining an amount of adjustment required to an input parameter associated with the amplifier element to cause the amplifier element to operate so that its measured signal is within the threshold amount of the desired signal;

adjusting by the adjustment amount an input parameter associated with the amplifier element for which the measured signal is not within the threshold amount of the desired signal; and measuring total output signal of the amplifier device and using the measurement of the total output signal to determine when to perform at least one of the step of determining threshold amount from a desired signal, and the step of adjusting an input parameter of an amplifier element.

10. The method of claim 9, wherein said steps are periodically performed.

11. The method of claim 9, wherein said steps are continuously performed.

12. The method of claim 9, wherein the signal measured through each of the plurality of amplifier elements is a current.

13. The method of claim 9, wherein the signal measured through each of the plurality of amplifier elements is a voltage.

14. An amplifier device comprising:

a signal divider for dividing an input signal into a plurality of substantially equal divided signals;

a plurality of tuner elements arranged in parallel so that each of the plurality of tuner elements receives one of the divided signals from said signal divider, each of said tuner elements being capable of adjusting its output in response to receipt of an adjustment signal;

a plurality of amplifier elements arranged in parallel so that each of the plurality of amplifier elements receives an output from one of the plurality of tuner elements;

a signal combiner for combining signals output by the plurality of amplifier elements into a total output signal of the amplifier device;

a plurality of signal measuring devices for measuring a signal through each of the plurality of amplifier elements;

a processor receiving the plurality of measured signals from said plurality of signal measuring devices for determining whether the measured signal for each of said plurality of amplifier elements deviates by a threshold amount from a desired signal, and if the deviation of the measured signal for any of said plurality of amplifier elements exceeds the threshold amount, for determining an amount of adjustment required to be transmitted to a tuner element transmitting its output to a deviating amplifier element to cause the deviating amplifier element to operate so that its measured signal is within the threshold amount of the desired signal, and for transmitting an adjustment signal to said tuner elements; and a means for measuring total output signal of the amplifier device, wherein said measurement of the total output signal to determine when to perform at least whether the measured signal for each of the plurality of amplifier elements should amount from a desired signal, and adjusting an input parameter of an amplifier element.

15. The amplifier device of claim 14, wherein said processor determines the adjustments periodically.

16. The amplifier device of claim 14, wherein said processor determines the adjustments continuously.

* * * * *